(12) United States Patent
Otremba et al.

(10) Patent No.: US 8,637,341 B2
(45) Date of Patent: Jan. 28, 2014

(54) SEMICONDUCTOR MODULE

(75) Inventors: Ralf Otremba, Kaufbeuren (DE); Josef Hoeglauer, Munich (DE); Helmut Strack, Munich (DE); Xaver Schloegel, Sachsenkam (DE)

(73) Assignee: Infineon Technologies AG, Neubiberg (DE)

( * ) Notice: Subject to any disclaimer, the term of this patent is extended or adjusted under 35 U.S.C. 154(b) by 651 days.

(21) Appl. No.: 12/046,680

(22) Filed: Mar. 12, 2008

(65) Prior Publication Data
US 2009/0230535 A1 Sep. 17, 2009

(51) Int. Cl.
*H01L 21/00* (2006.01)

(52) U.S. Cl.
USPC .............. 438/64; 438/68; 438/112; 438/127

(58) Field of Classification Search
USPC .......... 257/64, 68, 778, 707; 438/64, 68, 112, 438/127, 674
See application file for complete search history.

(56) References Cited

U.S. PATENT DOCUMENTS

| | | | |
|---|---|---|---|
| 6,133,634 A | 10/2000 | Joshi | |
| 6,573,119 B1 * | 6/2003 | Hirashima et al. | 438/64 |
| 6,582,990 B2 | 6/2003 | Standing | |
| 6,624,512 B2 | 9/2003 | Kurusu | |
| 6,677,669 B2 | 1/2004 | Standing | |
| 6,767,820 B2 | 7/2004 | Standing et al. | |
| 6,890,845 B2 | 5/2005 | Standing et al. | |
| 6,951,811 B2 * | 10/2005 | Sorimachi | 438/637 |
| 6,960,826 B2 * | 11/2005 | Ho et al. | 257/723 |
| 7,541,681 B2 | 6/2009 | Otremba | |
| 2002/0192867 A1 * | 12/2002 | Nishiyama | 438/110 |
| 2003/0036257 A1 | 2/2003 | Masumoto et al. | |
| 2005/0001329 A1 * | 1/2005 | Matsuki et al. | 257/777 |
| 2007/0262436 A1 * | 11/2007 | Kweon et al. | 257/686 |
| 2009/0102002 A1 * | 4/2009 | Chia et al. | 257/433 |

FOREIGN PATENT DOCUMENTS

| | | |
|---|---|---|
| DE | 10324615 A1 | 9/2004 |
| JP | 08115953 A | 4/2010 |

OTHER PUBLICATIONS

M. Brunnbauer et al., "Embedded Wafer Level Ball Grid Array (eWLB)", 2006 Electronics Packaging Technology Conference, pp. 1-5.

* cited by examiner

*Primary Examiner* — Steven Loke
*Assistant Examiner* — David Goodwin
(74) *Attorney, Agent, or Firm* — Dicke, Billig & Czaja, PLLC

(57) ABSTRACT

A semiconductor module. In one embodiment, at least two semiconductor chips are placed on a carrier. The at least two semiconductor chips are then covered with a molding material. An exposed portion of the at least two semiconductor chips is provided. A first layer of conductive material is applied over the exposed portion of the at least two semiconductor chips to electrically connect to a contact pad on the exposed portion of the at least two semiconductor chips. The at least two semiconductor chips are singulated.

16 Claims, 4 Drawing Sheets

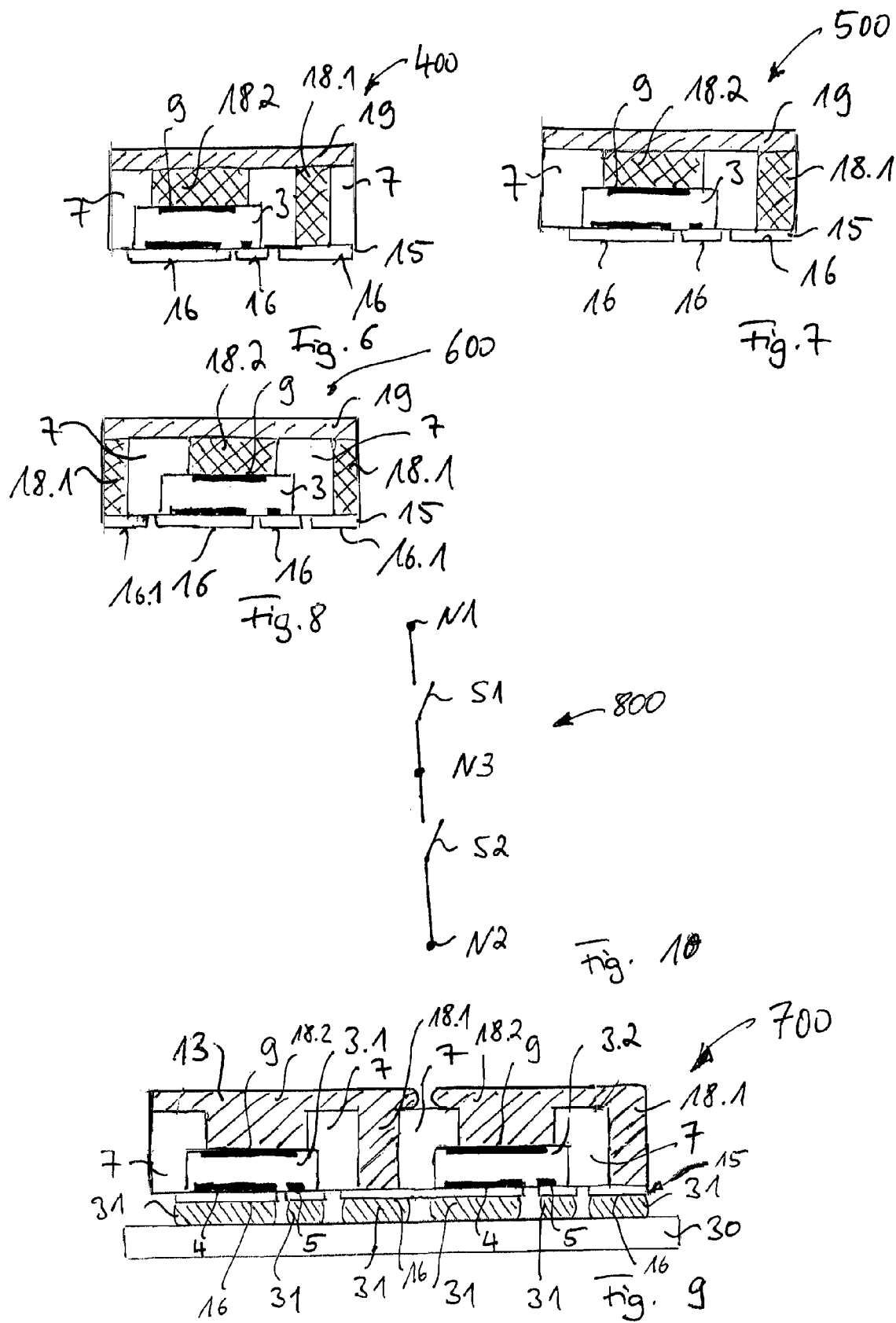

SEMICONDUCTOR MODULE

BACKGROUND

The invention relates to a semiconductor module and a method of manufacturing the same.

Semiconductor chips may be packaged. Cost efficient packages and methods of packaging are highly desired in the art. For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 6 schematically illustrates a fourth module in a cross section according to one embodiment.

FIG. 7 schematically illustrates a fifth module in a cross section according to one embodiment.

FIG. 8 schematically illustrates a sixth module in a cross section according to one embodiment.

FIG. 9 schematically illustrates a device in a cross section according to one embodiment.

FIG. 10 illustrates a basic circuit diagram of a half-bridge.

DETAILED DESCRIPTION

Figure 1A:
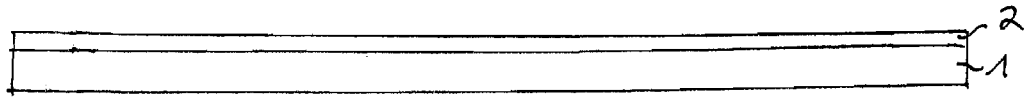
FIGS. 1A to 1G schematically illustrate one embodiment of a method to fabricate a module.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Modules with semiconductor chips are described below. The semiconductor chips may be of extremely different types and may include, for example, integrated electrical or electro-optical circuits. The semiconductor chips may, for example, be configured as power semiconductor devices such as power transistors, power diodes, IGBTs (Insulated Gate Bipolar Transistors), control circuits, microprocessors or microelectro-mechanical components.

In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, power transistors and power diodes may have a vertical structure. Further, RF (Radio Frequency) chips may be equipped with contact elements on both main surfaces.

By way of example, the source terminal and gate terminal of a power transistor, e.g., a MOSFET (Metal Oxide Semiconductor Field-Effect Transistor), and the anode terminal of a power diode, e.g., a Schottky-diode, may be situated on one main surface, while the drain terminal of the power transistor and the cathode terminal of the power diode are arranged on the other main surface. Furthermore, the modules described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals.

The semiconductor chips have contact elements (also referred to as contact pads) which allow electrical contact to be made with the semiconductor chips. The contact pads may be composed of any desired electrically conductive material, for example of a metal such as copper, aluminum or gold, a metal alloy or an electrically conductive organic material. In case of a power transistor, the contact pads include drain, source and gate terminals.

The modules further include an electrically insulating material, for example a molding material such as e.g., an epoxy-based material. The term "electrically insulating" refers to the property of the electrically insulating material to be at most only marginally electrically conductive relatively to electrically conductive components of the module. In case the electrically insulating material being a molding material it may be of any appropriate thermoplastic or thermosetting material. Various techniques may be employed to cover the semiconductor chips with the molding material, for example compression molding or injection molding. After curing, the molding material provides a rigid structure accommodating a plurality (e.g., typically more than 50) semiconductor chips. The structure may have a shape of a disc or plate which has a lateral dimension of more than 0.2 or even 0.3 m. Such structures containing a plurality of spaced-apart redistributed semiconductor chips are often termed "molded reconfigured wafer".

One or more electrically conductive layers are applied to the semiconductor chips. The electrically conductive layers may be used to make electrical contact with the semiconductor chips from outside the modules and to make electrical connections among the semiconductor chips. The electrically conductive layers may be manufactured with any desired geometric shape and any desired material composition. The electrically conductive layers may, for example, be composed of linear conductor tracks, but may also be in the form of a layer covering an area. Any desired electrically conductive materials, such as metals, for example aluminum, gold or copper, metal alloys or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between dielectric layers.

The modules described below may include external contact pads. The external contact pads may be accessible from outside the module and may allow electrical contact to be made with the semiconductor chips from outside the module. Furthermore, the external contact pads may be thermally conductive and may serve as heat sinks for dissipating the heat generated by the semiconductor chips. The external contact pads may be composed of any desired electrically conductive material, for example of a metal, such as copper, aluminum or gold, a metal alloy or an electrically conductive organic material. Surfaces of the external contact pads may form an assembly plane. The assembly plane may serve to mount the module onto another component, such as a circuit board for example.

FIGS. 1A to 1G exemplify stages of fabrication of a semiconductor module. In a first process (FIG. 1A) a carrier 1 is provided. The carrier 1 may be rigid or may be flexible to a certain degree and may be fabricated from materials such as metals, metal alloys or plastics. The carrier 1 may be electrically conductive or insulating. An adhesive tape 2 may be laminated on the carrier 1. The adhesive tape 2 may be a double sided sticky tape. In one embodiment, a glue material or any other adhesive material or mechanical securing means and mechanism (such as a clamping device or a vacuum generator) may be associated with the carrier 1.

Figure 1B:
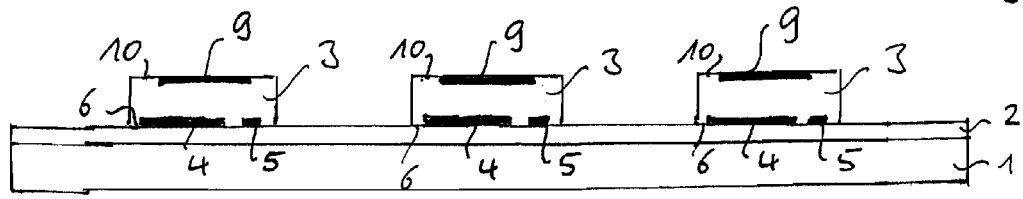

In FIG. 1B semiconductor chips 3 are placed on the carrier 1 and fixed using the adhesive tape 2 or other appropriate equipment. It is to be noted that throughout FIGS. 1A to 1G, only a partial section of the arrangement is illustrated, that is to say in practice, typically much more than three semiconductor chips 3 are placed on the carrier 1.

Semiconductor chips 3 may have a contact pad 9 on a first main chip surface 10 and contact pads 4, 5 on a second main chip surface 6 facing the carrier 1. If the semiconductor chips 3 are power transistors, the contact pad 9 may be a drain terminal, the contact pad 4 may be a source terminal and the contact pad 5 may be a gate terminal. In other cases, e.g., if the semiconductor chip 3 is a power diode, the contact pad 9 may be cathode terminal and only one contact pad (e.g., the anode terminal) may be provided on the second main chip surface 6. Typically, the second main chip surface 6 forms the active surface of the semiconductor chip 3.

Figure 1C:
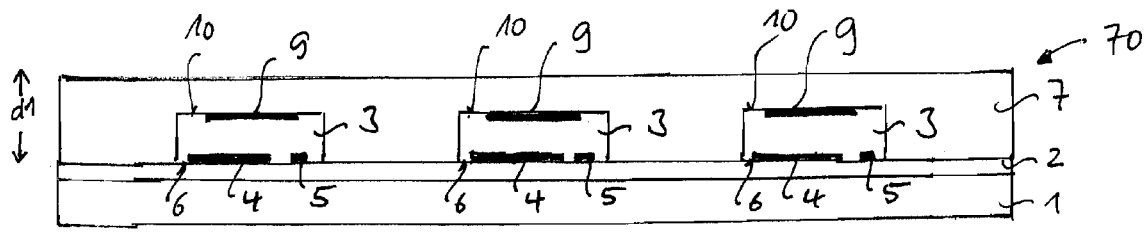

An electrically insulating molding material 7 may be applied to the semiconductor chips 3 and the carrier 1, see FIG. 1C. The molding material 7 may be used to encapsulate the semiconductor chips 3 except their bottom second main chip surface 6 containing the contact pads 4, 5. The molding material 7 may be an epoxy or another appropriate material used in contemporary semiconductor packaging technology. The molding material 7 may be composed of any appropriate thermoplastic or thermosetting material. After curing, the molding material 7 provides stability to the array of semiconductor chips 3. Various techniques may be employed to cover the semiconductor chips 3 with the molding material 7, for example compression molding or injection molding.

By way of example, in a compression molding process the liquid molding material 7 is dispensed into an open lower mold half of which the carrier 1 forms the bottom. Then, after dispensing the liquid molding material 7, an upper mold half is moved down and spreads out the liquid molding material 7 until a cavity between the carrier 1 forming the bottom of the lower mold half and the upper mold half is completely filled. This process may be accompanied by the application of heat and pressure. After curing, the molding material 7 is rigid. The larger the lateral size of the molded part 70 ("molded reconfigured wafer") and the number of embedded chips 3, the more cost efficient the process will typically be.

As may be seen from FIG. 1C, the semiconductor chips 3 may be completely over-molded, i.e. completely covered by molding material 7. By way of example, the molding material 7 in FIG. 1C may have a thickness d1 of about a couple of hundred micrometers, e.g., more than 200 µm, 500 µm or even more than 1000 µm. Thickness d1 is greater than the thickness of the semiconductor chips 3. As semiconductor wafers are often fabricated with a thickness of about 500 µm or 1000 µm, and may optionally be ground in front-end processes to be as small as about 200 µm or even less, the thickness of the semiconductor chip 3 may be e.g., in a range of about 200 µm to 1000 µm.

Figure 1D:
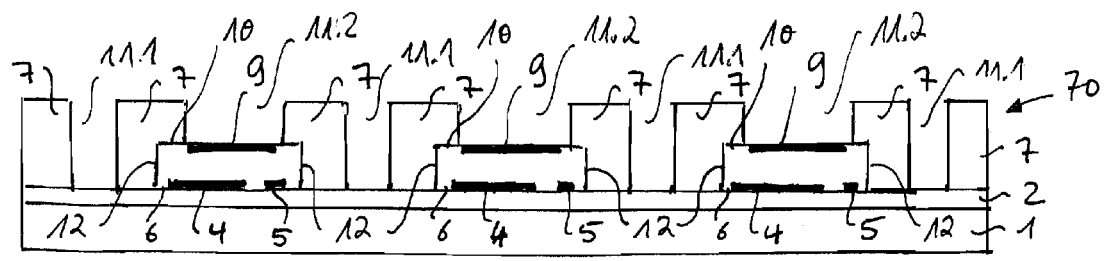

In a subsequent process, channels 11.1 and recesses 11.2 are provided in the molding material (FIG. 1D). The channels 11.1 extend through the molding material 7 of the molded part 70. These channels 11.1 may be of any shape, e.g., may have a slit-like shape or a column-like shape. The channels 11.1 are through-holes, i.e. open to both surfaces of the molded part 70. The channels 11.1 may have a lateral dimension or diameter in the range between 10 µm and 500 µm, more specifically between 50 µm and 100 µm. Further, if high currents are to be conducted, a plurality of channels 11.1 may be provided for each semiconductor chip 3. The channels 11.1 may be located in a spaced-apart relationship to the semiconductor chips 3 such that the semiconductor chips 3 remain covered with molding material 7 at their side faces 12. Recesses 11.2 are provided in the molding material 7 to expose at least a part of the first main surface 10 of the semiconductor chips 3 carrying the contact pad 9. The recesses 11.2 may have a lateral dimension or diameter greater than the lateral dimension or diameter of the contact pad 9.

The channels 11.1 and recesses 11.2 may be generated by drilling such as mechanical drilling or laser drilling. Another possibility is to use a photochemical process (photolithography, etching) in order to produce the channels 11.1 and recesses 11.2. Further, it may also be possible to introduce the channels 11.1 and/or recesses 11.2 at an earliest stage of the fabrication process, e.g., during the molding process. In this case, the upper mold half may be equipped with rods and/or blades or any elements having a positive shape of the channels 11.1 and/or recesses 11.2. FIG. 1D illustrates the molded part 70 after generation of the channels 11.1 and recesses 11.2.

After the structuring of the molding material 7, a conductive layer 13 is applied to the molded part 70. The conductive layer 13 may consist of a seed layer (not illustrated) and a further layer which is galvanically deposited onto the seed layer. An electroless deposition method may be used to produce the seed layer. The seed layer may have a thickness of up to 1 µm and may, for example, be made of zinc. The electrical conductivity of the seed layer may be used to galvanically deposit an electrically conductive layer, for example a copper layer, on the seed layer. The copper layer may have virtually any desired thickness depending on the application and current requirements. By way of example, the thickness of the copper layer may be in a range between 50 µm and 200 µm. As an alternative to the galvanic plating process described above, an electroless plating process such as electroless nickel plating may be used. Electroless plating is also referred to as chemical plating in the art. Further, other deposition methods such as physical vapor deposition (PVD), chemical vapor deposition (CVD), sputtering, spin-on processes, spray deposition or ink-jet printing may be employed to form the conductive layer 13.

The conductive layer 13 electrically contacts the contact pads 9 on the first main chip surface 10 by filling the recesses 11.2 and fills the channels 11.1. As a result, the bottom face of the conductive layer 13 within the channel 11.1 forms a contact terminal 14 which is exposed at the lower surface of the molded part 70. Thus, the conductive layer 13 provides for a wiring or interconnect structure to connect the "back side" chip contact pads 9 to a contact terminals 14 lying substantially in the same plane as the "front side" contact pads 4, 5 of the semiconductor chips 3.

In one embodiment, instead of using deposition methods, the wiring or interconnect structure may be generated using other techniques. By way of example, the channels 11.1 and recesses 11.2 may be filled by a conductive material (e.g., solder), and a sheet of metal (e.g., copper) may be bonded to the conductive elements made of the conductive material within the recesses 11.2 above the contact pads 9 and to the conductive elements made of the conductive material extending through the channels 11.1. This process will be explained later in more detail in conjunction with FIGS. 5A to 5D.

During fabrication, the conductive layer 13 (generated by deposition or applied as a metal sheet) may be structured. Structuring may result in regular pattern such as conductive lines. Structuring of the conductive layer 13 may be particularly useful if modules are intended to be manufactured which include a plurality of semiconductor chips 3 which are to be interconnected in a specific way.

Figure 1E:
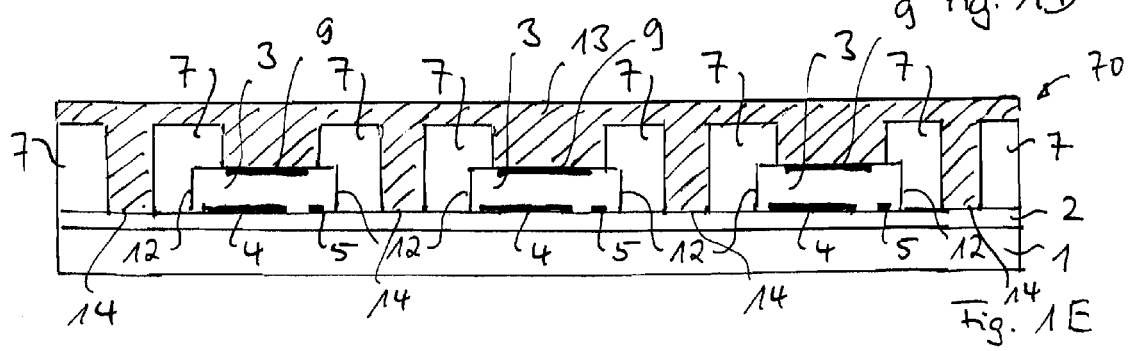
Figure 1F:
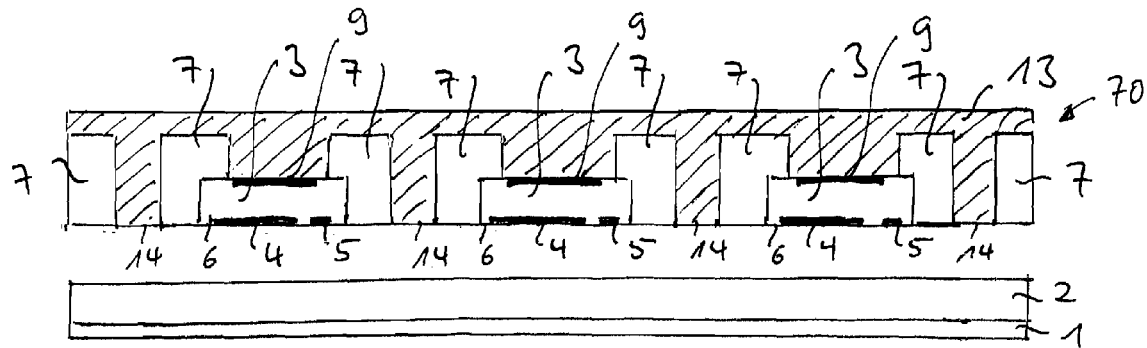

In FIG. 1F, the molded part 70 is released from the carrier 1. To this end, the adhesive tape 2 may feature thermo-release properties, which allow the removal of the adhesive tape 2 during a heat treatment. The removal of the adhesive tape 2 from the molded part 70 including the semiconductor chips 3 and the conductive layer 13 is carried out at an appropriate temperature which depends on the thermo-release properties of the adhesive tape 2 and is usually higher than 150° C., in one embodiment approximately 200° C.

It is to be noted that the release of the molded part 70 from the carrier 1 may also be accomplished at an earlier stage in the fabrication process, e.g., before applying the conductive layer 13 (FIG. 1E) or even before the generation of the channels 11.1 and recesses 11.2 (FIG. 1D).

Figure 1G:
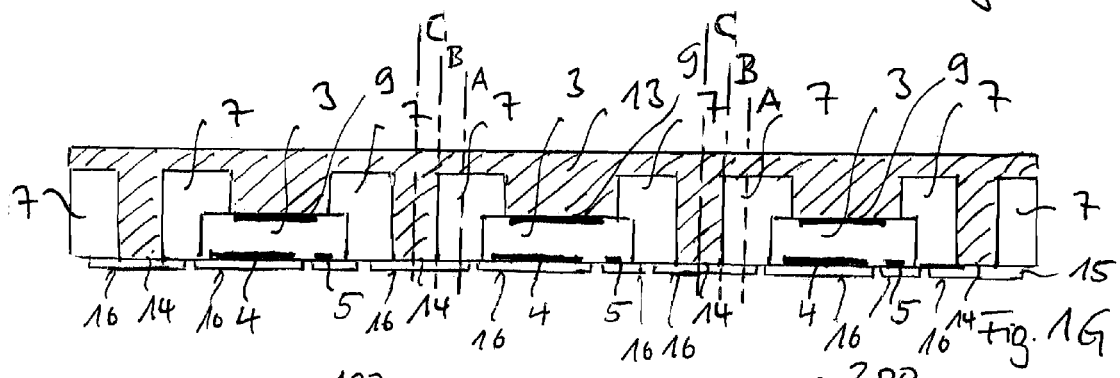

After the release of the carrier 1 and the adhesive tape 2, the bottom faces of the conductive elements extending through the channels 11.1, the bottom surface of the molding material 7 as well as the second main chip surface 6 containing the contact pads 4, 5 may form a common plane. As illustrated in FIG. 1G, a bottom conductive layer 15 may optionally be applied to this common plane. Similar to the conductive layer 13, the bottom conductive layer 15 may include a seed layer (not illustrated) and a further layer which may be galvanically deposited onto the seed layer. The seed layer may be an electrolessly deposited zinc layer and may have a thickness of up to 1 µm. The galvanically deposited layer may be a copper layer with a thickness of, e.g., up to 200 µm, and, in one embodiment, in the range between 50 µm and 100 µm. Alternative methods to deposit the bottom conductive layer 15 may be employed as discussed above in connection with the fabrication of the conductive layer 13.

The bottom conductive layer 15 may be structured such that insular sections 16 are formed which are connected to the contact pad 4 (e.g., source terminal), contact pad 5 (e.g., gate terminal) and bottom face 14 (e.g., drain terminal) of the conductive element extending through the channel 11.1. The separated sections 16 of the bottom conductive layer 15 may form external contact elements which enable to contact the drain, source and gate terminals of the semiconductor chip 3 (or, more generally spoken, various terminals located on opposite sides of the semiconductor chip 3) from outside. In other words, the separated sections 16 of the bottom conductive layer 15 may form an assembly plane which allows to mount modules (see e.g., FIGS. 2 to 4 and FIGS. 6 to 9) to be obtained from the molded part 70 onto a substrate such as e.g., a circuit board.

Further, the bottom conductive layer 15 may form a redistribution layer (RDL) at the assembly side of the modules. Instead of using one bottom conductive layer 15, a redistribution structure including a plurality of such redistribution layers could be generated. In such redistribution structure, several structured conductive layers (similar to structured conductive layer 15) are provided which are separated by polymer layers and interconnected by vias. Such redistribution structure may be fabricated by well-known thin-film technology processes and may provide a flexible signal routing and a design of the external terminals tailored to the customer's needs.

The molded part 70 is then separated to obtain single modules (FIG. 1G). Each module may contain one or more semiconductor chips 3. By way of example, separation may be performed at separation lines A, B, C. Separation may, for example, be accomplished by sewing.

Figure 2:
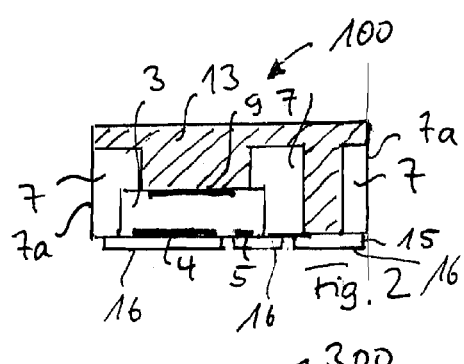
FIG. 2 schematically illustrates a first module in a cross section according to one embodiment.
Figure 3:
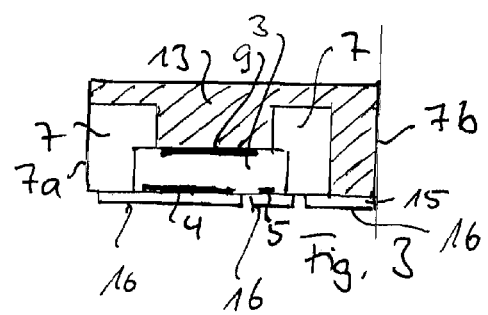
FIG. 3 schematically illustrates a second module in a cross section according to one embodiment.
Figure 4:
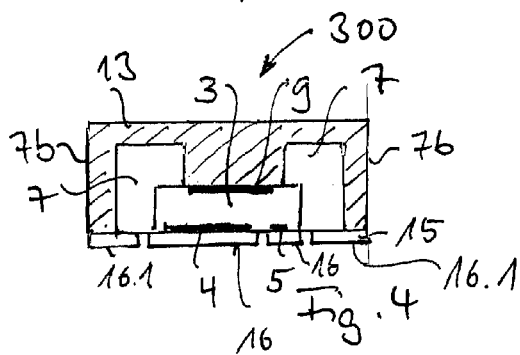
FIG. 4 schematically illustrates a third module in a cross section according to one embodiment.

FIGS. 2, 3 and 4 illustrate modules 100, 200, 300 obtained by separating the molded part 70 at separation lines A, B, C, respectively. According to separation line A, side faces 7a of module 100 made of molding material 7 are obtained. According to separation line B, one side face 7a of module 200 made of molding material 7 and one side face 7b of module 200 made of conductive material from the conductive layer 13 are obtained. According to separation line C, both side faces 7b of module 300 are made of conductive material from conductive layer 13. As a result, the modules 100, 200 and 300 have different properties in view of heat removal and their capability to be bonded to a heat sink. Further, the structural design of the bottom conductive layer 15 may depend on the choice of separation line A, B or C. By way of example, module 300 may have a circumferential or frame-shaped external drain terminal 16.1.

Figure 5A:
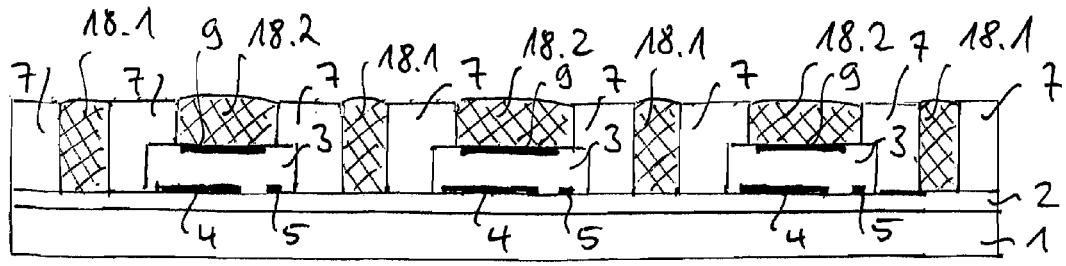
FIGS. 5A to 5D schematically illustrate one embodiment of a method to fabricate a module.

In FIGS. 5A to 5D different stages of another manufacturing process to fabricate modules 400, 500, 600 illustrated in FIGS. 6, 7 and 8, respectively, are illustrated. The first fabrication processes are the same as illustrated in FIGS. 1A to 1D, and reference is made to the corresponding description in order to avoid reiteration. Then, as illustrated in FIG. 5A, the channels 11.1 and recesses 11.2 are filled with a conductive material e.g., a metal or solder. The conductive material forms conductive elements 18.1 extending through the channels 11.1 and conductive elements 18.2 filling the recesses 11.2.

The conductive material may be applied by printing techniques. By way of example a solder paste may be squeezed into the channels 11.1 and recesses 11.2 by using a screen printing process. Other techniques may also be possible.

Figure 5B:
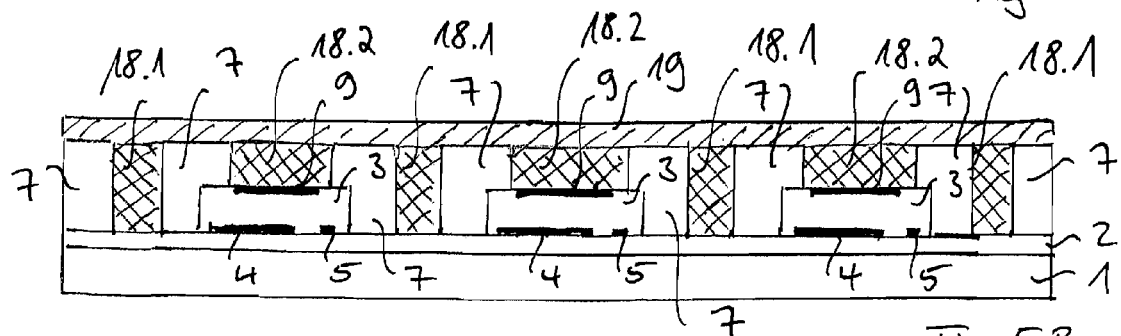

After filling the channels 11.1 and recesses 11.2 with the conductive elements 18.1 and 18.2, respectively, the conductive layer 13 is applied, see FIG. 5B. To this end, deposition methods as described in conjunction with the first embodiment (FIGS. 1A to 1G) may be used. In one embodiment, it is also possible to attach a metal sheet 19 (e.g., made of copper) to the upper side of the molded part 70. The metal sheet 19 may have any desired thickness, e.g., in a range between 50 µm and 200 µm. A conductive adhesive such as e.g., a solder deposit (not illustrated) is applied to the top of each conductive element 18.1, 18.2 (this is not needed if the conductive elements 18.1, 18.2 are itself made of a conductive adhesive such as solder) and the metal sheet 19 is placed into contact with the upper side of the molded part 70. Then, by the application of heat, a solder reflow is used to bond the contact elements 18.1, 18.2 to the metal sheet 19 (FIG. 5B). As a result, a structure similar to the arrangement illustrated in FIG. 1E is obtained.

Figure 5C:
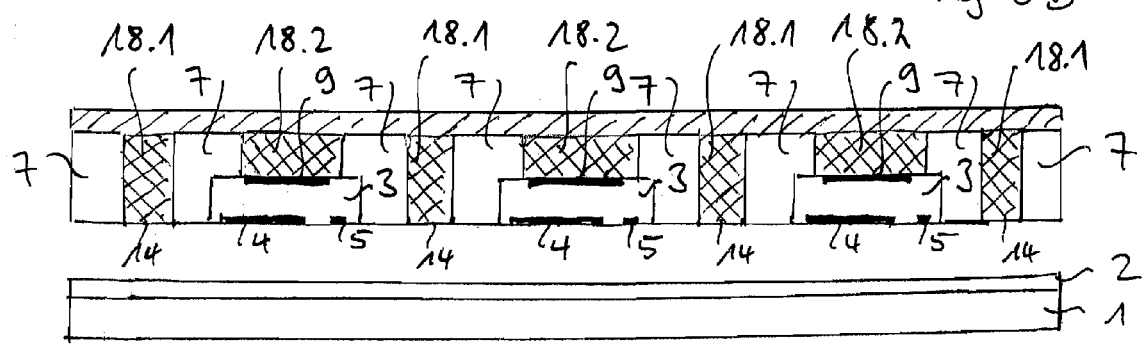
Figure 5D:
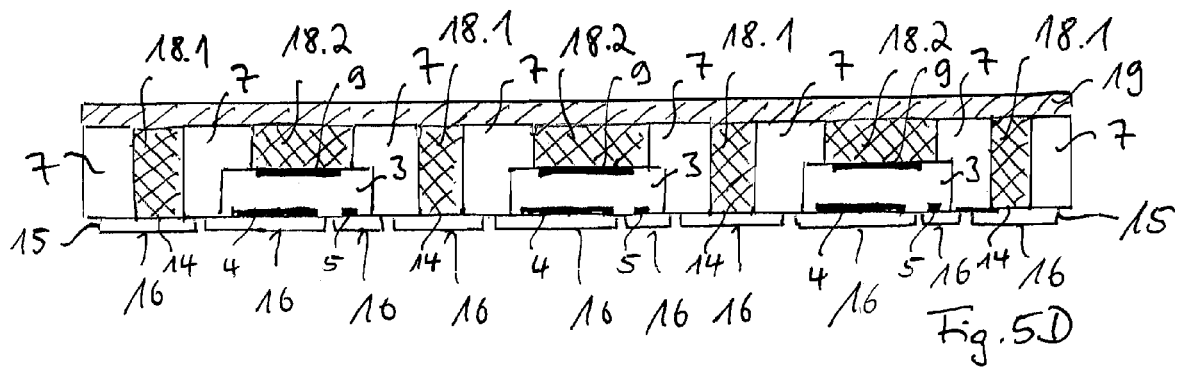

The subsequent manufacturing steps of the second embodiment illustrated in FIGS. 5C and 5D correspond to the manufacturing processes described in conjunction with FIGS. 1F and 1G, respectively, of the first embodiment. Further, modules 400, 500, 600 illustrated in FIGS. 6, 7 and 8 are similar to modules 100, 200, 300 explained with reference to FIGS. 2, 3 and 4, respectively. If the conductive elements 18.1 are made of solder, the bottom conductive layer 15 may be omitted or removed under the conductive elements 18.1, and the solder of the conductive elements 18.1 may be used to directly bond the conductive elements 18.1 to a substrate.

The modules 100, 200, 300, 400, 500, 600 do not contain a carrier such as a leadframe. To the contrary, the electrically conductive layers 13 and 15 are plated on both main surfaces 6, 10 of the semiconductor chips 3. While the conductive layer 13 provides for a "back-side" interconnect, the bottom conductive layer 15 provides for a "front-side" interconnect as well as an assembly structure for mounting the module 100, 200, 300, 400, 500, 600 on a substrate. As the conductive layer 13 and the bottom conductive layer 15 are interconnected by contact elements 18.1 extending through channels 11.1, this makes it possible to arrange all external contact pads 16 on the bottom surface of the module 100, 200, 300, 400, 500, 600. Moreover, the surfaces of the external contact pads 16 connected to the drain and source terminals of the semiconductor chip 3 may be larger than the surface of the external contact pad 16 connected to the gate terminal of the semiconductor chip 3. The enlarged surfaces for the drain and source terminals may be useful when high currents flow through the vertical power device. The stability of the modules 100, 200, 300, 400, 500, 600 may be provided by the molding material 7.

In FIG. 9 an example of how two semiconductor chips 3.1, 3.2 may be connected to each other by the conductive layer 13 (which may e.g., be realized by a deposited metal layer or a metal sheet 19) and the bottom conductive layer 15 is schematically illustrated. In module 700, by way of example, the two semiconductor chips 3.1, 3.2 are power transistors. The contact pad 9 (drain terminal) of the first semiconductor chip 3.1 is connected to the contact pad 4 (source terminal) of the second semiconductor chip 3.2 by the conductive layer 13 and the structured bottom conductive layer 15. Having the connection as illustrated in FIG. 9, the module 700 can be used as a half-bridge. A basic circuit of a half-bridge 800 arranged between two nodes N1 and N2 is illustrated in FIG. 10. The half-bridge 800 includes two switches S1 and S2 connected in series. The semiconductor chips 3.2 and 3.1 may be implemented as the two switches S1 and S2, respectively. When compared to the module 700 illustrated in FIG. 9, the node N1 is the drain terminal (contact pad 9) of semiconductor chip 3.2, the node N3 arranged between the two switches S1 and S2 is the drain terminal (contact pad 9) of the first semiconductor chip 3.1 and the node N2 is the source terminal (contact pad 4) of the first semiconductor chip 3.1.

The half-bridge 800 may, for example, be implemented in electronic circuits for converting DC voltages, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage.

Returning to FIG. 9, the exposed surfaces 16 of the bottom conductive layer 15 forming the external contact pads of module 700 may be used to electrically couple the module 700 to other components. This is exemplarily illustrated in FIG. 9. There, the module 700 is mounted onto a substrate 30 such as a circuit board, for example a PCB (printed circuit board). Solder deposits 31 may have been used to solder the external contact pads to contact areas (not illustrated) of the circuit board 30. It is to be noted that the conductive layer 13 has been structured in order to electrically separate the drain terminals (contact pads 9) of the two semiconductor chips 3.1, 3.2.

On top of all modules 100, 200, 300, 400, 500, 600, 700, a heat sink or cooling element (not illustrated) may be attached. The heat sink may be thermally coupled to an insulating material (not illustrated) coating the structured conductive layer 13. If the thermal conductivity of the electrically insulating material is high enough and/or if the material thickness of the electrically insulating material above the conductive layer 13 is not too large, the electrically insulating material may allow to transfer the heat generated by the semiconductor chips 3.1 and 3.2 to the heat sink, which dissipates the generated heat. In this connection, it is to be noted that the metal sheet 19 may be specifically adapted to form a mounting platform for a heat sink. By way of example, the metal sheet 19 may be equipped with a top insulating dielectric layer laminated onto the metal layer. Further, the metal sheet 19 may be part of a ceramic substrate, e.g., a DCB (direct copper bonded) substrate. Another possibility is to use a multi-layer metal-dielectric-metal sandwich structure for the metal sheet 19 to be applied to the molded part ("molded reconfigured wafer") 70. In this case, a heat sink may directly be bonded to the insulated metal surface of the multi-layer metal sheet 19.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:

placing at least two semiconductor chips on a carrier, each chip having a first main surface with at least one contact pad and a second main surface with a plurality of contact pads, the second main surface of each semiconductor chip mounted on the carrier;

covering the at least two semiconductor chips and the carrier with molding material;

providing a recess to the first main surface of each of the at least two semiconductor chips, including to at least a portion of the at least contact pad, by removing a first portion of the molding material covering the first main surface of each of the at least two semiconductor chips;

selectively removing portions of the molding material to form channels through the molding material to the carrier to selectively expose portions of the carrier;

applying a first layer of conductive material over the molding material, wherein the first layer of conductive material fills the recess to each of the at least two semiconductor chips and electrically connects to the at least one contact pad thereon and fills the channels to cover the exposed portions of the carrier;

removing the carrier; and singulating the at least two semiconductor chips such that for each of the at least two semiconductor chips, the first layer of conductive material extends from the at least one contact pad on the first main surface through at least one of the channels through the molding material, wherein a surface of the conductive material filling the channel is coplanar with the second main surface of the chip, so that a surface of the molding material, the second main surface of the semiconductor chip, including the plurality of contact pads thereon, and the at least one contact on first main surface of the semiconductor chip, represented by the conductive material filling the channel, form a common plane for mounting.

2. The method of claim 1, wherein selectively removing the first portion of the molding material covering the first main surface of each of the at least two semiconductor chips forms a contact hole in the molding material to the first main surface of each of the at least two semiconductor chips.

3. The method of claims 2, comprising performing selectively removing of the first portion of the molding material by at least one of mechanical drilling, laser drilling and etching.

4. The method of claim 1, comprising performing selectively removing portions of the molding material to form channels by at least one of mechanical drilling, laser drilling and etching.

5. The method of claim 1, comprising applying the conductive material of the first layer by a deposition process.

6. A method of manufacturing a semiconductor device, comprising:

placing at least two semiconductor chips on a carrier;

covering the at least two semiconductor chips placed on the carrier with molding material;

providing for an exposed portion of each of the at least two semiconductor chips by removing a first portion of the molding material from each of the at least two semiconductor chips;

selectively removing portions of the molding material to form openings through the molding material to the carrier to selectively expose portions of the carrier;

applying a first layer of conductive material over the exposed portion of each of the at least two semiconductor chips and over the exposed portion of the carrier, wherein the first layer of conductive material electrically connects to a contact pad on the exposed portion of each of the at least two semiconductor chips and extends into and fills the openings and covers the exposed portion of the carrier;

removing the at least two semiconductor chips and molding material from the carrier;

depositing a second layer of conductive material over a main surface of the molding material and of each of the at least two semiconductor chips which was formerly attached to the carrier; and structuring the second layer of conductive material to form contact pads on each of the portions of the first layer of conductive material extending into the openings through the molding materials exposed by removal of the carrier and on contact areas on the main surfaces of each of the at least two semiconductor chips exposed by removal of the carrier, the contact pads serving as external terminals of the semiconductor device.

7. The method of claim 6, wherein the exposed portion of each of the at least two semiconductor chips is provided by selectively removing the first portion of the molding material from each of the at least two semiconductor chips, wherein selectively removing the first portion of the molding material from each of the at least two semiconductor chips results in the formation of a contact hole in the molding material over each of the at least two semiconductor chips.

8. A method of manufacturing a semiconductor device comprising:

placing a row of semiconductors chips on a carrier, each semiconductor chip having a front side facing the carrier and an opposing backside;

covering the semiconductor chips and carrier with a molding material;

forming a plurality of recesses through the molding material, one recess through the molding material to the backside of each semiconductor chip to expose a contact pad there on;

forming a plurality of channels through the molding material to the carrier, one channel between successive semiconductor chips of the row, one disposed before a first semiconductor chip of the row, and one disposed after a last semiconductor chip of the row;

applying a first layer of electrically conductive material which fills the recesses and connects to the contact pad on the backside of each semiconductor chip and which extends over the molding material and fills each of the channels and covers a portion of the carrier exposed at a bottom of each channel;

removing the carrier;

applying a second layer of electrically conductive material over a surface formed by the frontside of each semiconductor chip and portions of the first layer of electrically conductive material at the bottoms of the channels and of the molding material exposed by removal of the carrier;

structuring the second layer of electrically conductive material to form a contact terminal on the first layer of electrically conductive material at the bottom of each channel and to form contact terminals for each of a plurality of contact pads on the frontside of each semiconductor chip; and singulating the semiconductor chips such that for each semiconductor chip the first layer of electrically conductive material extends from the contact pad on the backside to at least one contact terminal at the bottom of a channel via at least one of the channels.

9. The method of claim 8, including:

forming the channels so as to be evenly spaced apart from one another and from side edges of the semiconductor chips, each channel having first and second vertical sides; and singulating the chips in a region of mold material between the first vertical side of each channel and each of the semiconductor chips to form modules with side edges comprising mold material.

10. The method of claim 8, including:

forming the channels so as to be evenly spaced apart from one another and from side edges of the semiconductor chips, each channel having first and second vertical sides; and singulating the chips at the first vertical side of each channel to form modules with one side edge comprising electrically conductive material and an opposing side edge comprising mold material.

11. The method of claim 8, including:

forming the channels so as to be evenly spaced apart from one another and from side edges of the semiconductor chips, each channel having first and second vertical sides; and singulating the chips substantially at a midpoint of each channel to form modules with side edges comprising electrically conductive material.

12. The method of claim 8, wherein each semiconductor chip is a power transistor and for each semiconductor chip, the contact pad on the backside is a drain contact and the plurality of contact pads on the frontside comprises a source contact and a gate contact.

13. The method of claim 1, wherein the at least two semiconductor chips comprise power transistors, wherein that at least one contact pad on the first main surface consists of a drain terminal and the plurality of contact pads on the second main surface consists of a source terminal and a gate terminal.

14. The method of claim 1, wherein selectively removing portions of the molding material to form channels includes forming channels spaced from side edges of the at least two semiconductor chips, including forming a channel in molding material disposed between first side edges of the at least two semiconductor chips, the first side edges of the at least two semiconductor chips facing one another, and forming channels spaced from a second side edge of each of the at least two semiconductor chips, the second side edge of each of the at two semiconductor chips being opposite the first side edge.

15. The method of claim 14, wherein singulating comprises singulating the chips at the first vertical side of each channel to form modules comprising one of the chips and one of the channels and having one side edge comprising molding material and an opposing side edge comprising electrically conductive material of the associated channel.

16. The method of claim 14, wherein singulating comprises singulating the chips through the channels to form modules with side edges comprising electrically conductive material.

* * * * *